United States Patent
Zhao et al.

(10) Patent No.: US 12,382,680 B2
(45) Date of Patent: Aug. 5, 2025

(54) LATERAL DIFFUSION METAL OXIDE SEMICONDUCTOR DEVICE AND MANUFACTURING METHOD THEREFOR

(71) Applicant: CSMC TECHNOLOGIES FAB2 CO., LTD., Jiangsu (CN)

(72) Inventors: Jingchuan Zhao, Jiangsu (CN); Nailong He, Jiangsu (CN); Sen Zhang, Jiangsu (CN); Zhili Zhang, Jiangsu (CN); Hao Wang, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 481 days.

(21) Appl. No.: 17/912,760

(22) PCT Filed: Jul. 2, 2021

(86) PCT No.: PCT/CN2021/104142
§ 371 (c)(1),
(2) Date: Sep. 19, 2022

(87) PCT Pub. No.: WO2022/142229
PCT Pub. Date: Jul. 7, 2022

(65) Prior Publication Data
US 2023/0146299 A1   May 11, 2023

(30) Foreign Application Priority Data

Dec. 30, 2020 (CN) .................. 202011630768.9

(51) Int. Cl.
| | | |
|---|---|---|
| *H10D 62/10* | (2025.01) | |
| *H01L 21/265* | (2006.01) | |
| *H01L 21/266* | (2006.01) | |
| *H10D 30/01* | (2025.01) | |
| *H10D 30/65* | (2025.01) | |
| *H10D 62/17* | (2025.01) | |

(52) U.S. Cl.
CPC ...... *H10D 62/111* (2025.01); *H01L 21/26513* (2013.01); *H01L 21/266* (2013.01);
(Continued)

(58) Field of Classification Search
CPC .. H10D 62/126; H10D 62/105; H10D 30/655; H10D 62/111; H10D 30/0281;
(Continued)

(56) References Cited

U.S. PATENT DOCUMENTS

| | | | | |
|---|---|---|---|---|
| 8,969,950 | B2 * | 3/2015 | Pan | ................. H10D 30/0293 257/330 |
| 2001/0050375 | A1 * | 12/2001 | Van Dalen | ........... H10D 64/112 257/E29.328 |

(Continued)

FOREIGN PATENT DOCUMENTS

| | | |
|---|---|---|
| CN | 103426913 A | 12/2013 |
| CN | 103579351 A | 2/2014 |

(Continued)

*Primary Examiner* — Galina G Yushina
(74) *Attorney, Agent, or Firm* — MUNCY, GEISSLER, OLDS & LOWE, P.C.

(57) ABSTRACT

A laterally diffused metal-oxide-semiconductor (LDMOS) device and a method for fabricating the LDMOS device are disclosed. The device includes: a substrate (101) having a second conductivity type; a drift region (102) that has a first conductivity type and is disposed on the substrate (101), wherein the first conductivity type is opposite to the second conductivity type; a plurality of layers of doped structures disposed in the drift region (102), each layer of the doped structure comprising at least one doped bar (105) extending in a lengthwise direction of a conductive channel; and a plurality of doped polysilicon pillars (106) disposed in the drift region (102) so as to extend downward through the doped bar (105) of at least one of the layer of doped structures, wherein ions doped in the doped polysilicon pillars (106) and ions doped in the doped bar have opposite conductivity types.

15 Claims, 6 Drawing Sheets

(52) U.S. Cl.
CPC ......... *H10D 30/0281* (2025.01); *H10D 30/65* (2025.01); *H10D 62/116* (2025.01); *H10D 62/393* (2025.01)

(58) Field of Classification Search
CPC .. H10D 30/65; H10D 62/116; H10D 30/0221; H10D 62/393; H10D 30/021; H01L 21/26513; H10L 21/266
See application file for complete search history.

(56) References Cited

U.S. PATENT DOCUMENTS

| | | | | |
|---|---|---|---|---|
| 2003/0190789 | A1* | 10/2003 | Salama | H10D 62/111 257/E29.022 |
| 2005/0082610 | A1* | 4/2005 | Shibib | H10D 30/65 257/E29.268 |
| 2005/0218431 | A1* | 10/2005 | Nair | H10D 30/663 257/262 |
| 2007/0187781 | A1* | 8/2007 | Kocon | H10D 64/117 257/408 |
| 2008/0138954 | A1* | 6/2008 | Cai | H10D 30/658 257/E29.066 |
| 2010/0123171 | A1* | 5/2010 | Yang | H10D 30/603 257/272 |
| 2017/0179278 | A1* | 6/2017 | Baldwin | H10D 64/117 |
| 2019/0259875 | A1* | 8/2019 | Li | H10D 62/393 |

FOREIGN PATENT DOCUMENTS

| | | |
|---|---|---|
| CN | 109119479 A | 1/2019 |
| CN | 109378343 A | 2/2019 |
| CN | 110518056 A | 11/2019 |

* cited by examiner

LATERAL DIFFUSION METAL OXIDE SEMICONDUCTOR DEVICE AND MANUFACTURING METHOD THEREFOR

CROSS-REFERENCE TO RELATED APPLICATION

This application claims the priority of Chinese patent application number 2020116307689, filed on Dec. 30, 2020, entitled "LATERAL DIFFUSION METAL OXIDE SEMICONDUCTOR DEVICE AND MANUFACTURING METHOD THEREFOR", the entire contents of which are incorporated herein by reference.

TECHNICAL FIELD

The present invention relates to the field of semiconductor device fabrication and, in particular to a laterally diffused metal-oxide-semiconductor (LDMOS) device, as well as to a method for fabricating an LDMOS device.

BACKGROUND

The statements in this section merely provide background information related to the present application and does not necessarily constitute prior art.

For a laterally diffused metal-oxide-semiconductor (LDMOS) device, a tradeoff must be made between its breakdown voltage (BV) and on-resistance. Designers are seeking an LDMOS device with a minimized on-resistance and a breakdown voltage remaining unchanged.

SUMMARY OF THE INVENTION

In view of this, it is necessary to provide an LDMOS device with an increased breakdown voltage/a reduced on-resistance and a method for fabricating such an LDMOS device.

An LDMOS includes: a substrate having a second conductivity type; a drift region disposed on the substrate and having a first conductivity type that is opposite to the second conductivity type; a plurality of layers of doped structures disposed in the drift region, wherein each layer of doped structure comprises at least one doped bar extending in a lengthwise direction of a conductive channel; and a plurality of doped polysilicon pillars that are disposed in the drift region and extend downward through the doped bars of at least one of the layer of doped structures, wherein ions doped in the doped polysilicon pillars and ions doped in the doped bars have opposite conductivity types.

A method for fabricating an LDMOS device includes: step A, obtaining a substrate with a drift region, wherein the drift region has a first conductivity type and is formed on the substrate having a second conductivity type, and wherein the first conductivity type is opposite to the second conductivity type; step B, forming a plurality of implantation holes in the drift region by etching; step C, implanting dopant ions at a bottom of each implantation hole; step D, filling doped polysilicon into the implantation holes, wherein the doped polysilicon and the dopant ions have opposite conductivity types, wherein the doped polysilicon and the dopant ions have opposite conductivity types; step E, implanting dopant ions at a top of the doped polysilicon in each implantation hole that is located in the drift region, wherein the doped polysilicon and the dopant ions have opposite conductivity types; repeating steps D and E for a predetermined number of times, such that each implantation hole is filled up with the doped polysilicon, wherein the dopant ions implanted into the drift region by different implantations form doped regions with different depths; and step F, forming doped bars extending in a lengthwise direction of a conductive channel by performing a thermal treatment to cause the doped regions at a same depth to diffuse and merge in the lengthwise direction of a conductive channel.

BRIEF DESCRIPTION OF THE DRAWINGS

In order to better describe and illustrate embodiments and/or examples of those inventions disclosed herein, reference may be made to one or more accompanying drawings. The additional details or examples used to describe the accompanying drawings should not be considered as limitations to the scope of any one of the disclosed inventions, the presently described embodiments and/or examples, and the presently understood best mode of these inventions.

DETAILED DESCRIPTION

Figure 1:
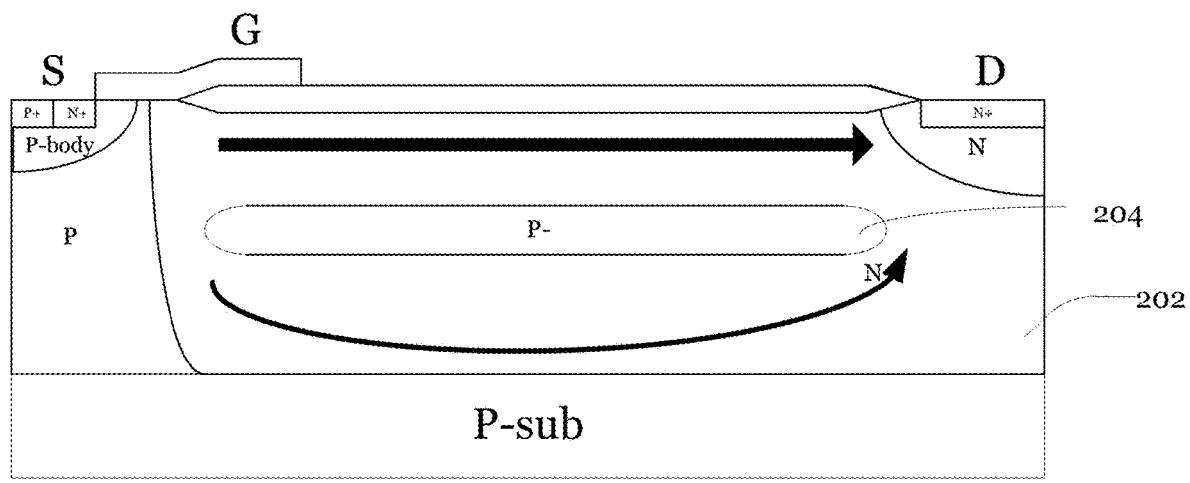
FIG. 1 is a schematic diagram showing the structure of an exemplary laterally diffused metal-oxide-semiconductor (LDMOS) device with a P-type buried layer formed in a drift region.

In order to facilitate an understanding of the present invention, the invention is described more fully below with reference to the accompanying drawings, which show preferred embodiments for practicing the invention. However, the present invention may be implemented in many different forms and should not be construed as being limited to the embodiments set forth herein. Rather, these embodiments are provided so that this disclosure will be thorough and complete.

Unless defined otherwise, all technical and scientific terms used herein have the same meaning as commonly understood by one of ordinary skills in the art to which this invention belongs. The terminology used herein is for the purpose of describing particular embodiments only and is not intended to be limiting of this invention. As used herein, the term "and/or" includes any and all combinations of one or more of the associated listed items.

When an element or a layer is referred to as being "on", "adjacent to", "connected to" or "coupled to" another element or layer, it can be directly on, adjacent to, or connected or coupled to the other element or layer, or intervening elements or layers may also be present. In contrast, when an element is referred to as being "directly on" "directly adjacent to", "directly connected to" or "directly coupled to" another element, there are no intervening elements or layers present. It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "under", "below", "lower", "beneath," "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under", "below" or "beneath" other elements or features would then be oriented "over" the other elements or features. Thus, the exemplary terms "under" and "beneath" can encompass both an orientation of "over" and "under". The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Embodiments of the present invention are described herein with reference to cross-sectional and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

As used herein, terms in the art of semiconductor are technical terms commonly used by those skilled in the art. For example, for P- and N-type impurities, in order to distinguish different doping concentrations, heavy P-type doping is represented in brief as "P+", moderate P-type doping as "p", light P-type doping as "P−", heavy N-type doping is represented as "N+", moderate N-type doping as "N", light N-type doping as "N−".

FIG. 1 is a schematic diagram showing the structure of an exemplary laterally diffused metal-oxide-semiconductor (LDMOS) device with a P-type buried layer formed in a drift region. In this structure, the P-type buried layer 204 is formed by directly implanting P-type ions (e.g., boron ions) into the drift region (N-well) 202. In this structure, there are a conductive channel in the drift region 202 above the P-type buried layer 204 and another conductive channel in the drift region 202 below the P-type buried layer 204 (as indicated by the two arrows in the figure). When the LDMOS device is turned off and withstanding a reverse voltage, the P-type buried layer 204 can significantly facilitate depletion of the N-type impurity in the drift region 202, increasing a concentration of the N-type impurity in the drift region and resulting in a lowered on-resistance.

The inventor believes that the N-type conductive channel above the P-type buried layer 204 is the shortest source-to-drain conductive path and enables the LDMOS to have a lower overall on-resistance when it has a greater depth. However, due to limited implantation energy of ion implantation machines, the P-type ions can be implanted only to a limited depth, making the N-type conductive channel region above the P-type buried layer 204 too thin to have desirable electrical conduction properties and unable to impart a significant decrease in on-resistance to the LDMOS.

Figure 2:
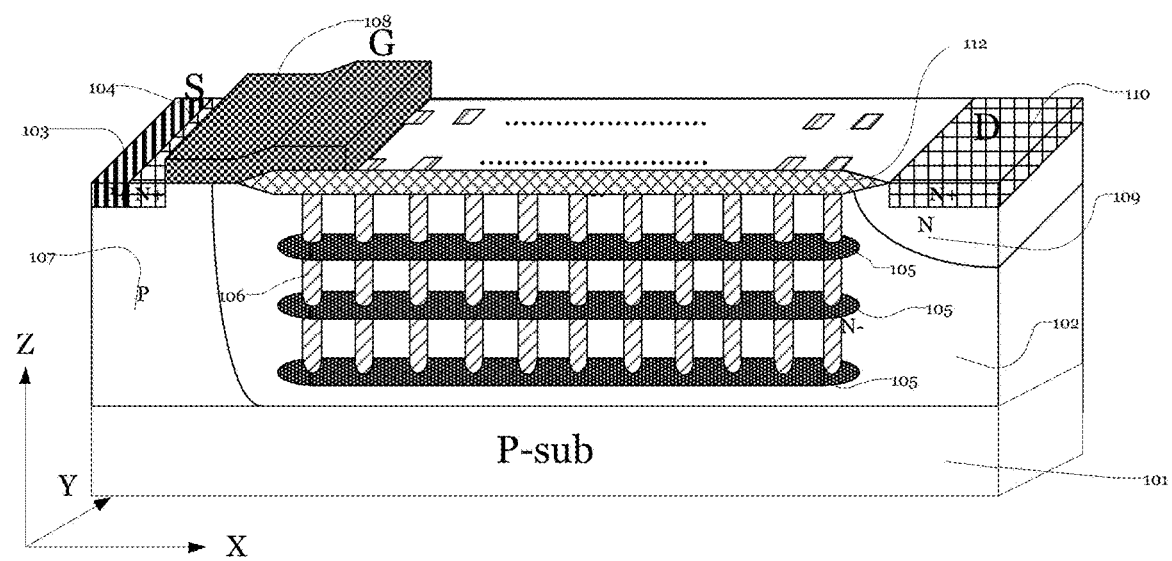
FIG. 2 is a schematic diagram showing the structure of an LDMOS device according to an embodiment.

The present application proposes a method for fabricating a novel LDMOS device and a structure thereof. The structure enables the LDMOS device to have improved reverse voltage resistance and a reduced on-resistance. FIG. 2 is a schematic diagram showing the structure of the LDMOS device according to an embodiment, which includes a substrate 101, a drift region 102, a plurality of doped polysilicon pillars 106 and a plurality of layers of doped structures. All the layers of doped structures are arranged in the drift region 102. Each layer of doped structure includes at least one doped bar 105 extending in a lengthwise direction of conductive channels (i.e., the X direction in FIG. 2). In the embodiment illustrated in FIG. 2, the device is an N-type LDMOS (NLDMOS) device, the substrate 101 is a P-type substrate, and the drift region 102 is an N-type drift region (which may be in particular an N-drift region) disposed above the substrate 101. The doped polysilicon pillars 106 are all disposed in the drift region 102 and each extends downward through the doped bar 105 of at least one of the layers of doped structures. In this way, the longitudinal doped polysilicon pillars 106 are interlaced with the transverse (i.e., extending in the lengthwise direction of the conductive channels) doped bars 105 to form a mesh-like structure in the drift region 102. A type of conductivity of ions doped in the polysilicon pillars 106 is opposite to a type of conductivity of ions doped in the bars.

In one embodiment of the present application, the bars 105 are N-type doped, and the polysilicon pillars 106 are P-type doped. The P-type doped polysilicon pillars 106 extending within the N-type drift region 102 can optimize an electric field therein, maximizing a breakdown voltage of the device when it is withstanding a reverse voltage. The transverse N-type doped bars can provide the conductive channels at different depths, which result in a lower on-resistance. Additionally, the doped bars 105 have dopant ion concentrations higher than a dopant ion concentration of the drift region 102. In this way, the conductive channels provided by the N-type doped bars have low resistances.

In another embodiment of the present application, the bars 105 are P-type doped, and the polysilicon pillars 106 are N-type doped. The P-type doped bars 105 form, together with the N-type drift region 102, multiple RESURF (Reduced Surface Field) structures. When the device is withstanding a reverse voltage, the doped bars 105 at different depths within the rift region 102 can significantly facilitate depletion of the N-type impurity in the drift region 102, enabling the device to have an optimized breakdown voltage. Meanwhile, the longitudinal P-type doped polysilicon pillars in the drift region 102 can effectively increase an ion concentration of the N-type impurity in the drift region 102, resulting in a reduced on-resistance.

In the embodiment illustrated in FIG. 2, the LDMOS device further includes a source region 104, a drain region 110, a field oxide layer 112, a gate 108 and a substrate pickup region 103. In the transverse direction (i.e., the lengthwise direction of the conductive channels, and also the X direction in FIG. 2), the doped polysilicon pillars 106 are located between the N-type source region 104 and the N-type drain region 110 (both are N+ regions in the embodiment shown in FIG. 2). The ellipses in FIG. 2 indicate multiple doped polysilicon pillars 106, the depiction of which is omitted. The field oxide layer 112 is located on the drift region 102 so that the bottom of the field oxide layer 112 is in contact with tops of the doped polysilicon pillars 106. In FIG. 2, in order to make the underlying doped polysilicon pillars 106 visible, the extension of the field oxide layer 112 in the Y direction is not depicted. The gate 108 is made of polysilicon and extends toward the source region 104 from a location of the field oxide layer 112 proximal to the source region 104. The substrate pickup region 103 is a P-type doped region (which may be in particular a P+ region). It is arranged on the side of the source region 104 away from the gate 108 and is brought into contact with the source region 104.

In the embodiment illustrated in FIG. 2, the LDMOS device further includes a well region 107 of a second conductivity type. The well region 107 of the second conductivity type is a source-side region of the LDMOS device, in which the source region 104 and the substrate pickup region 103 are contained. A concentration of the well region 107 of the second conductivity type has an impact on the depletion of the drift region and on a threshold voltage. In one embodiment of the present application, an ion concentration of the second conductivity type in the well region 107 is lower than an ion concentration of the second conductivity type in the substrate pickup region 103.

In the embodiment illustrated in FIG. 2, the LDMOS device further includes a well region 109 of a first conductivity type. The well region 109 of the first conductivity type is a drain-side N-type region, in which the drain region 110 is contained to enable forward on-current optimization.

In the embodiment illustrated in FIG. 2, the doped polysilicon pillars 106 extend downward from the bottom of the field oxide layer 112 through all the other doped bars 105 and terminate within the lowermost doped bars 105. Further, in the cross-section of each layer of doped structure, there are multiple parallel doped bars 105, and the doped polysilicon pillars 106 are arranged into a matrix in the cross-section.

In the embodiment illustrated in FIG. 2, the doped bars 105 in each layer of doped structure are not interconnected in the Y direction (in a widthwise direction of the conductive channels).

In one embodiment, the substrate 101 is a semiconductor substrate and may be made of non-doped monocrystalline silicon, monocrystalline silicon doped with an impurity, silicon-on-insulator (SOI), strained silicon-on-insulator (SSOI), strained silicon germanium on insulator (S—SiGeOI), silicon germanium on insulator (SiGeOI), germanium on insulator (GeOI) or the like. In the embodiment illustrated in FIG. 2, the substrate 101 is made of monocrystalline silicon.

In the embodiment illustrated in FIG. 2, the gate 108 is made of polysilicon. In other embodiments, the gate 108 may be alternatively made of a metal, a metal nitride, a metal silicide or a similar compound.

In one embodiment, the field oxide layer 112 is made of silicon dioxide.

Figure 3A:
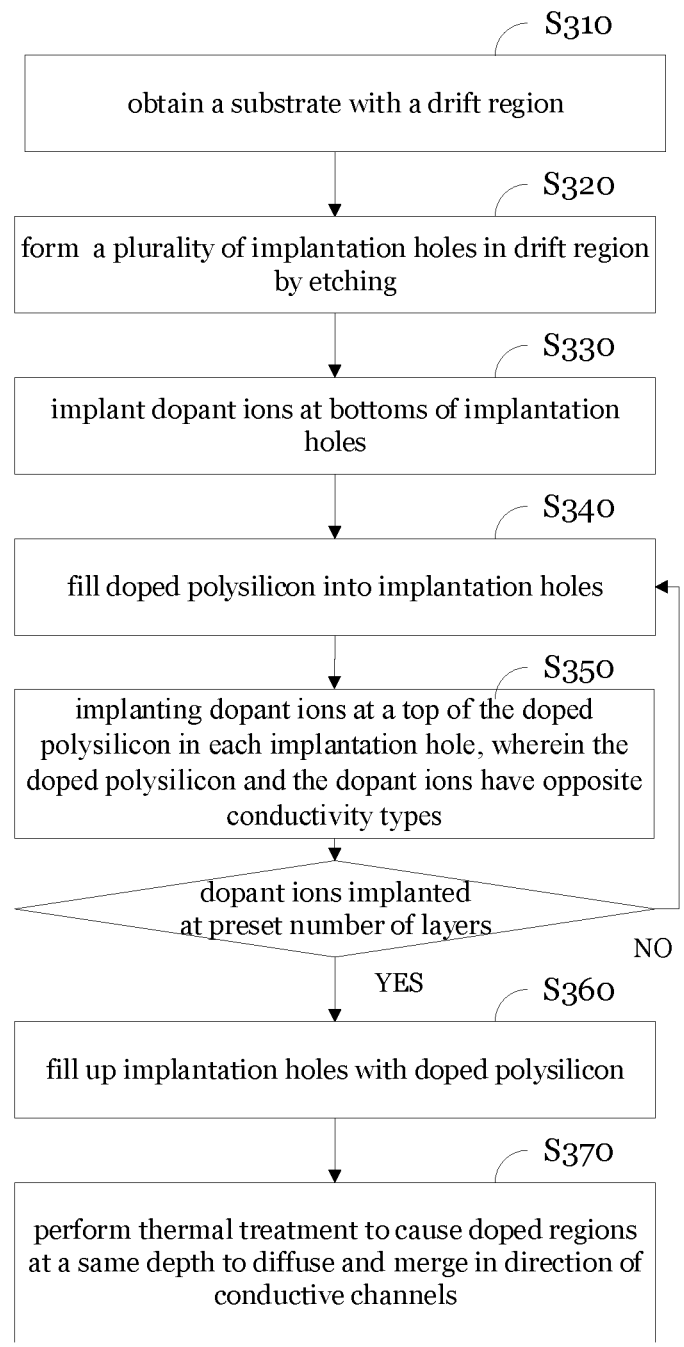
FIGS. 3a and 3b each shows a flow diagram of a method for fabricating an LDMOS device according to an embodiment.

The present application correspondingly provides a method for fabricating an LDMOS device, which can be used to fabricate the LDMOS device according to any one of the foregoing embodiments. FIG. 3a shows a flowchart of the method according to one embodiment. The method includes the steps as follows:

S310: providing a substrate with a drift region.

The drift region of the first conductivity type is formed on the substrate that is of the second conductivity type. In this embodiment, the LDMOS device is an N-type LDMOS (NLDMOS) device. That is, the first conductivity type is N-type, and the second conductivity type is P-type. In alternative embodiments, the first conductivity type may be P-type, with the second conductivity type being N-type.

S320: forming a plurality of implantation holes in the drift region by an etching process.

Figure 4:
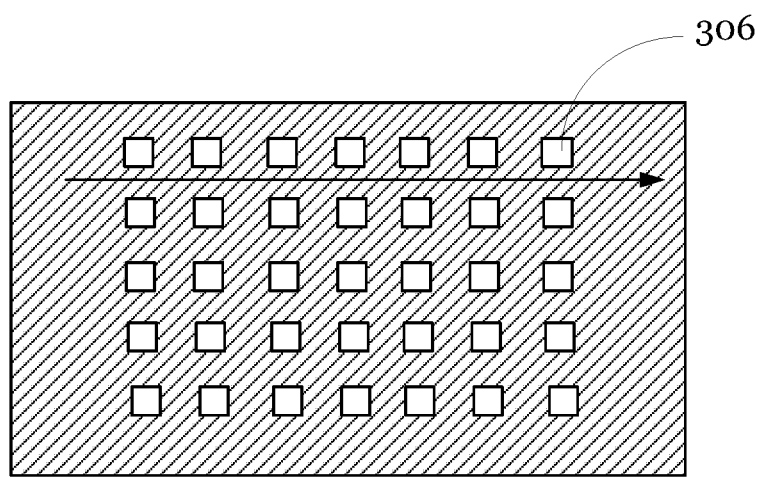
FIG. 4 is a top view of implantation holes according to an embodiment.
Figure 5:
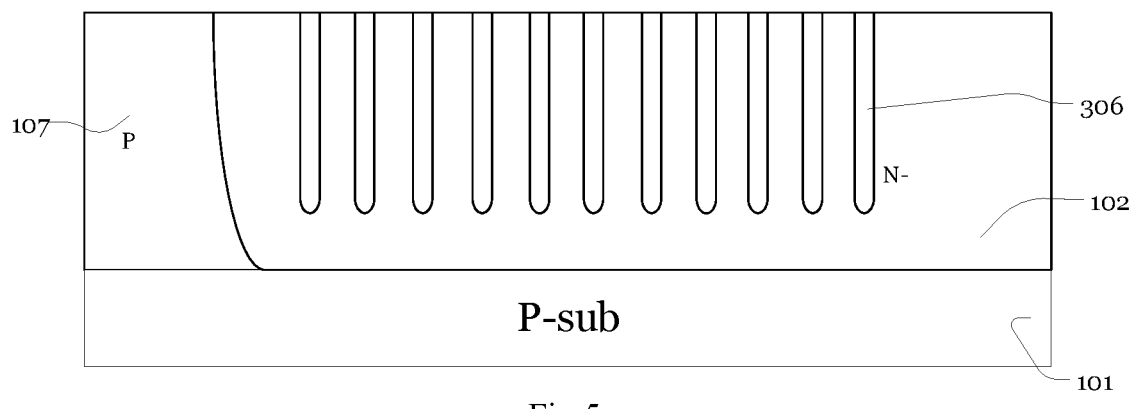
FIG. 5 is a schematic cross-sectional view of a structure formed after step S320 is performed according to an embodiment.

In this embodiment, the implantation holes are formed at parts of the drift region and the formation involves a photolithography process. In one embodiment of the present application, depths of the implantation holes are set depending on an intended depth of a lowermost doped bar. FIG. 4 is a top view of the implantation holes according to an embodiment. These implantation holes 306 are arranged into a matrix. In one embodiment of the present application, subsequent to step S310 and prior to step S320, the method further includes forming a well region 107 of the second conductivity type in the substrate. FIG. 5 is a schematic cross-sectional view of a structure after step S320 is performed according to an embodiment. The well region 107 of the second conductivity type is formed as a region where channels of the device are to be formed, and a concentration thereof has an impact on depletion of the drift region and on a threshold voltage.

S330: implanting dopant ions at bottoms of the respective implantation holes.

Figure 6:
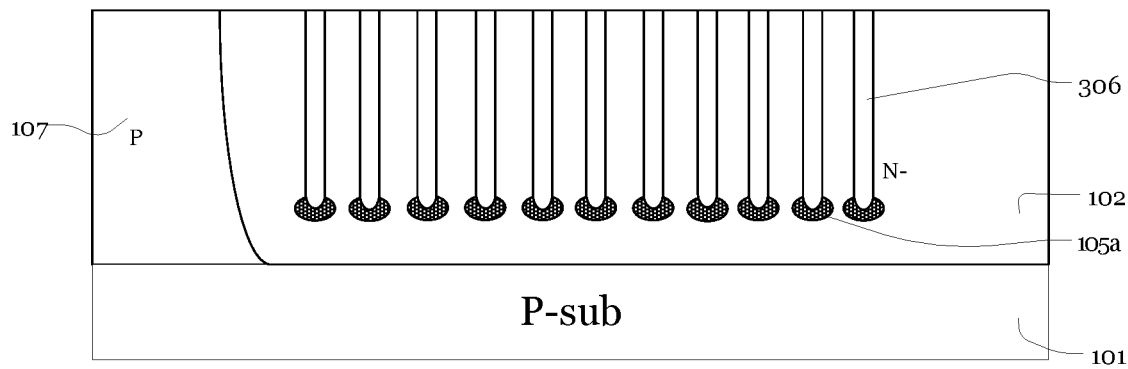
FIG. 6 is a schematic cross-sectional view of a structure formed after step S330 is performed according to an embodiment.

In one embodiment of the present application, the ion implantation is carried out in the presence of a photoresist pattern formed in the photolithography process in step S320 and resulting in the formation of doped regions 105a under the implantation holes 306. FIG. 6 is a schematic cross-sectional view of a structure after step S330 is performed according to an embodiment.

S340: filling the implantation holes with doped polysilicon.

Figure 3B:
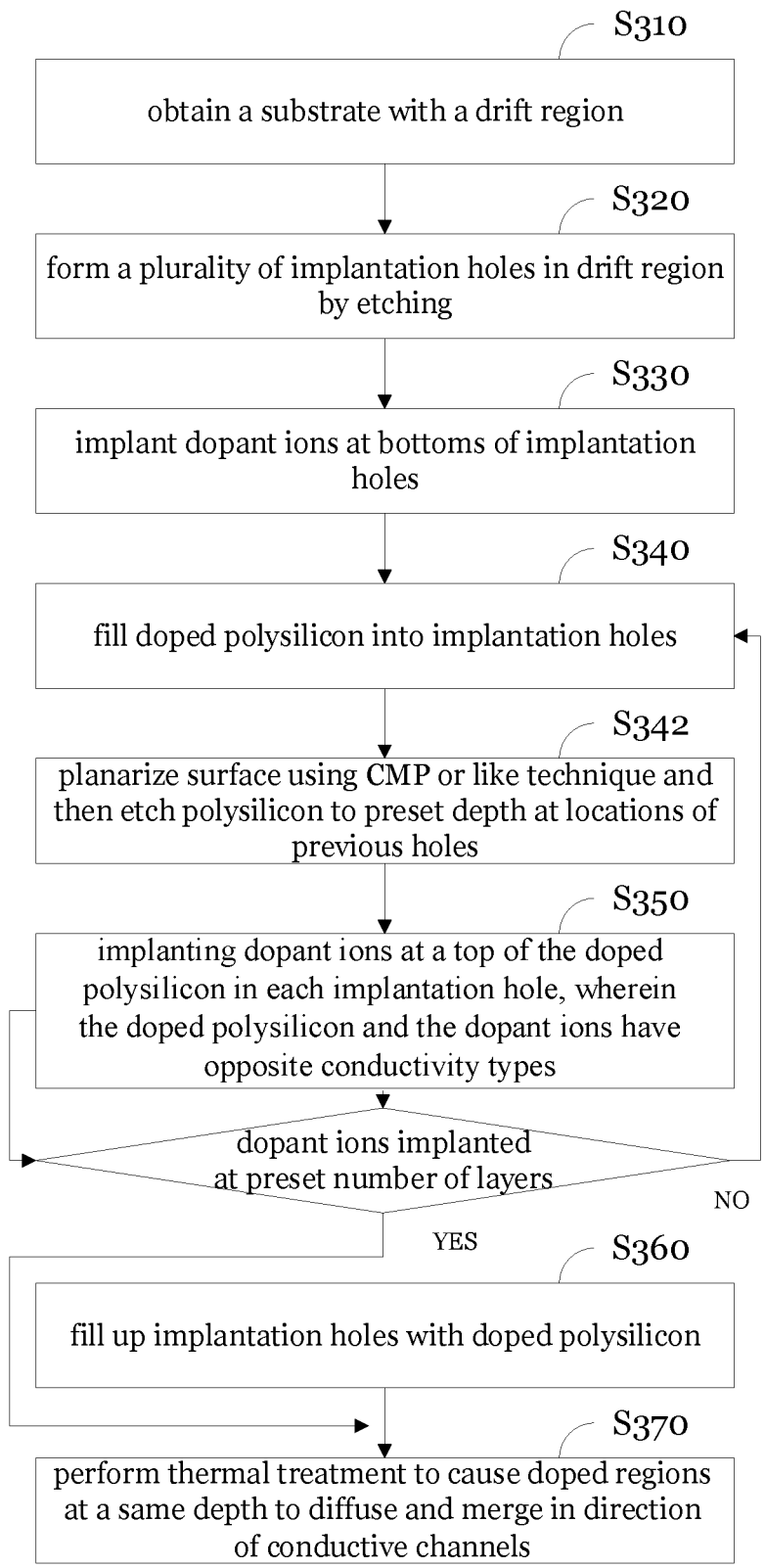
Figure 7:
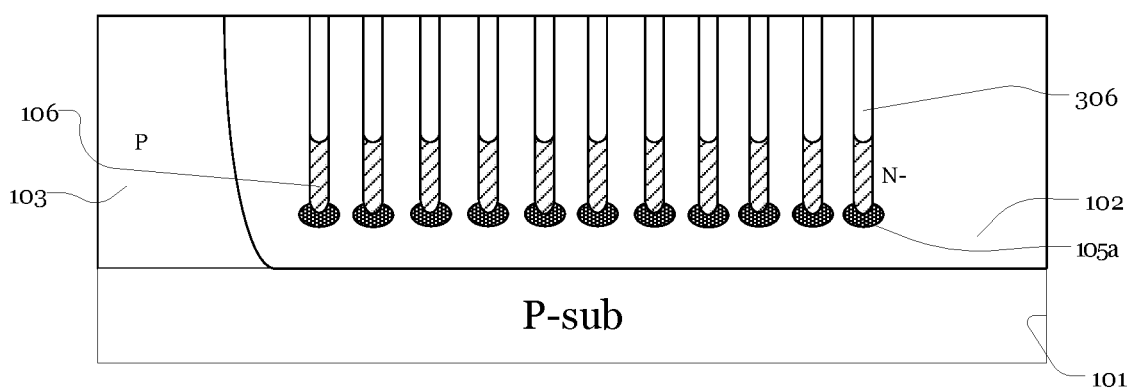
FIG. 7 is a schematic cross-sectional view of a structure formed after step S340 is performed according to an embodiment.

A predetermined thickness of the doped polysilicon of the opposite type of conductivity as the dopant ions in step S330 is filled. Referring to FIG. 3b, in one embodiment of the present application, in step S340, N- or P-type polysilicon is filled using a physical vapor deposition (PVD) or chemical vapor deposition (CVD) technique, and the polysilicon deposited over the wafer surface is removed using a chemical mechanical polishing (CMP) or similar technique in step S342. After that, the doped polysilicon 106 filled in the implantation holes 306 is etched to a depth shallower than the depth reached by the previous etching process performed to form the implantation holes 306, so that a part of the doped polysilicon 106 remains in the holes. FIG. 7 is a schematic cross-sectional view of a structure after step S340 is performed according to an embodiment.

S350: implanting ions of the opposite type of conductivity to the doped polysilicon at top of the doped polysilicon in the implantation holes located in the drift region.

Figure 8:
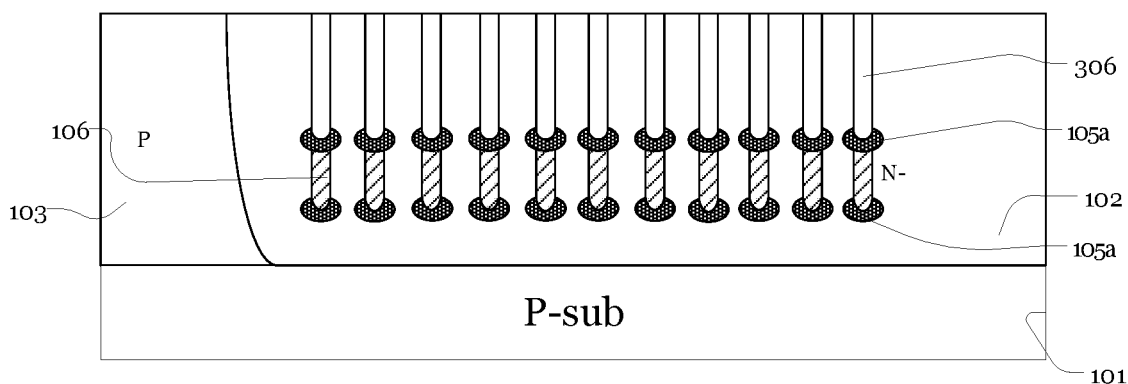
FIG. 8 is a schematic cross-sectional view of a structure formed after step S350 is performed according to an embodiment.

Referring to FIG. 8, as a result of the ion implantation, doped regions 105a are formed around the bottoms of the new implantation holes 306 formed by the etching process. A junction depth of the doped regions 105a formed by this implantation process differs from that of the previous implantation process.

Figure 9:
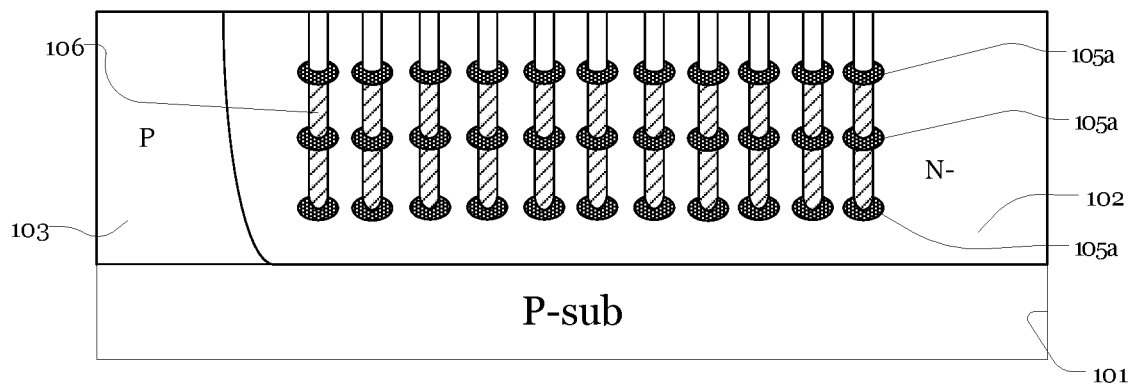
FIG. 9 shows a structure formed after steps S340 and S350 are repeated once on the structure of FIG. 8.

After that, steps S340 and S350 are repeated several times until a predetermined number of layers of doped regions 105a are formed. It would be appreciated that dopant ions implanted in different implantation processes result in the doped regions 105a at different depths in the drift region 102. FIG. 9 shows a structure formed by repeating steps S340 and S350 once on the structure of FIG. 8.

S360: filling the implantation holes with doped polysilicon.

Figure 10:
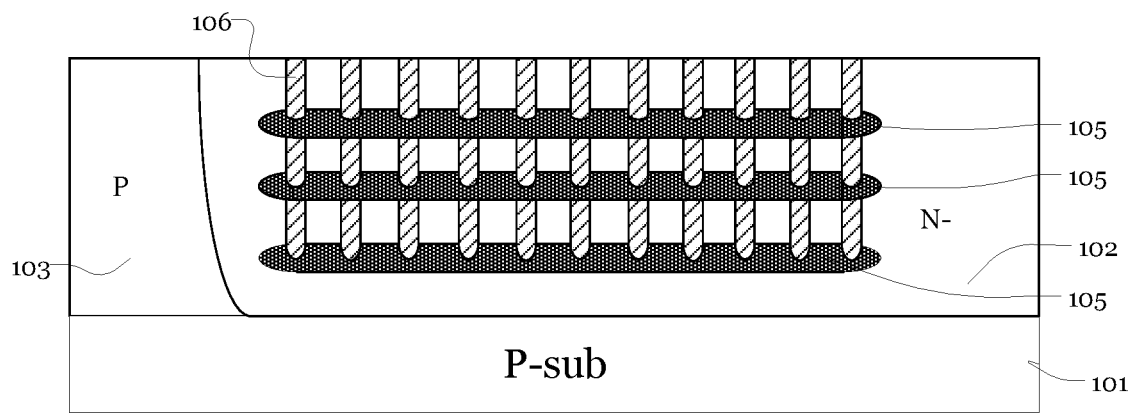
FIG. 10 is a schematic cross-sectional view of a resulting device after step S360 is performed according to an embodiment.

The same doped polysilicon as in step S340 is filled. FIG. 10 is a schematic cross-sectional view of a resulting device after step S360 is performed according to an embodiment. In one embodiment of the present application, N- or P-type polysilicon is filled using a physical vapor deposition (PVD) or chemical vapor deposition (CVD) technique, and the polysilicon deposited over the wafer surface is removed using a chemical mechanical polishing (CMP) or similar technique.

S370: performing a thermal treatment so that the doped regions in each single layer expand and merge in the lengthwise direction of the conductive channels.

The structure resulting from step S360 is thermally treated (to cause diffusion) so that the doped regions 105a expand and merge in the lengthwise direction of the conductive channels, resulting in the formation of doped bars 105 extending in the lengthwise direction of the conductive channels. In one embodiment of the present application, the doped bars 105 in each layer are not interconnected in the widthwise direction of the conductive channels.

In the above method, the implantation holes formed enable ion implantation processes to be performed at any desired depths to form multiple RESURF structures/conductive channels within the drift region. The method enables the resulting LDMOS device to have actual junction depths of the doped bars 105 substantially as expected.

In one embodiment of the present application, the bars 105 are N-type doped, and the polysilicon pillars 106 are P-type doped. The P-type doped polysilicon pillars 106 extending within the N-type drift region 102 can optimize an electric field therein, maximizing a breakdown voltage of the device when it is withstanding a reverse voltage. The transverse N-type doped bars can provide the conductive channels at different depths, which result in a lower on-resistance. In step S380, ions of the P-type impurity are activated to diffuse within the drift region 102 and repair damage of the N-type doped polysilicon. Further, the doped bars 105 have a dopant ion concentration higher than a dopant ion concentration of the drift region 102. In this way, the conductive channels provided by the N-type doped bars have low resistance.

In another embodiment of the present application, the bars 105 are P-type doped, and the polysilicon pillars 106 are N-type doped. The P-type doped bars 105 form, together with the N-type drift region 102, multiple RESURF (Reduced Surface Field) structures. When the device is withstanding a reverse voltage, the doped bars 105 at different depths within the rift region 102 can significantly facilitate depletion of the N-type impurity in the drift region 102, enabling the device to have an optimized breakdown voltage. Meanwhile, the longitudinal P-type doped polysilicon pillars in the drift region 102 can effectively increase an ion concentration of the N-type impurity in the drift region 102, resulting in a reduced on-resistance.

After the step S370 is completed, the remaining of the LDMOS device is formed (step S380). In one embodiment of the present application, step S380 may be accomplished using conventional techniques.

In one embodiment of the present application, step S380 includes the steps as detailed below.

A well region 109 of the first conductivity type is formed. The well region 109 of the first conductivity type serves as a drain-side drift region buffer layer and enables the LDMOS device to have a higher on-state breakdown voltage when it is forward conducted to operate, thus achieving forward on-current optimization. In this embodiment, the well region 109 of the first conductivity type is an N-well, and the well region 107 of the second conductivity type is a P-well.

A field oxide layer 112 is formed over the drift region 102.

A gate 108 is formed. In this embodiment, the gate 108 is made of polysilicon and extends beyond the field oxide layer 112 from an edge thereof over the well region 107 of the second conductivity type.

Figure 11:
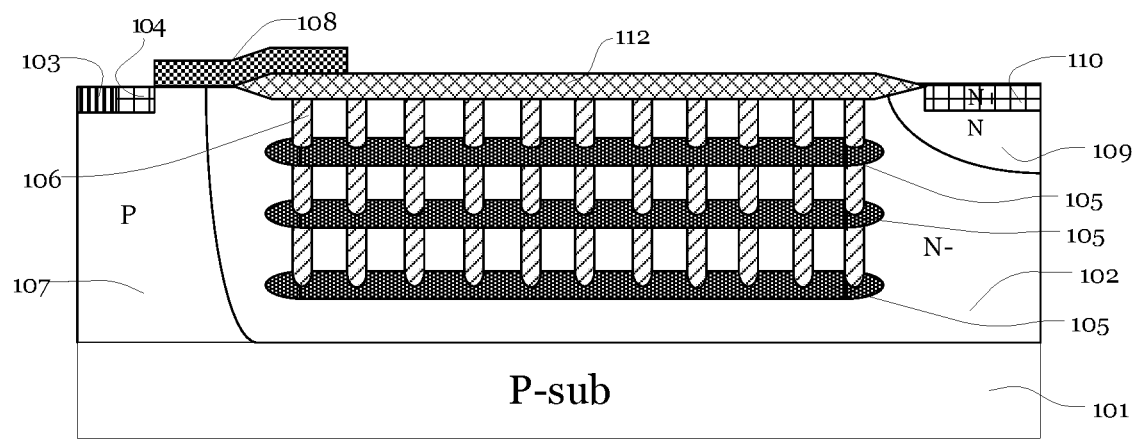
FIG. 11 is a schematic cross-sectional view of the structure shown in FIG. 2.

A source region 104, a drain region 110 and a substrate pickup region 103 are formed. The source region 104 and the substrate pickup region 103 are formed by ion implantation in the well region 107 of the second conductivity type, and the drain region 110 is formed in the well region 109 of the first conductivity type. In this embodiment, the source region 104 and the drain region 110 are N+ regions, and the substrate pickup region 103 is a P+ region, as shown in FIG. 11.

An interlayer dielectric (ILD) layer is formed. The ILD layer is formed over the wafer surface resulting from the previous step.

Contact holes are formed. The contact holes extend through the ILD layer and may be formed by etching at locations needing to be connected to the device surface.

Metal electrodes of gate, drain and source are formed.

Reference throughout this specification to "some embodiments", "other embodiments", "idealized embodiments" or the like means that a particular feature, structure, material, or characteristic described in connection with the embodiments or examples is included in at least one embodiment or example of the invention. Thus, the appearances of those phrases in various places throughout this specification are not necessarily referring to the same embodiment or example of the invention.

The various technical features of the foregoing embodiments may be combined in any way. Although not all such combinations have been described above for the sake of brevity, any one of the combinations is considered to fall within the scope of this specification as long as there is no contradiction between the technical features.

Presented above are merely several embodiments of the present invention. Although these embodiments are described with some particularity and in some detail, it should not be construed that they limit the scope of the present application in any sense. It should be noted that various variations and modifications can be made by those of ordinary skill in the art without departing from the concept of the present application. Accordingly, it is intended that all such variations and modifications are embraced within the scope of this application as defined in the appended claims.

What is claimed is:

1. A laterally diffused metal-oxide-semiconductor (LDMOS) device, comprising:
   a substrate having a second conductivity type;
   a drift region disposed on the substrate and having the first conductivity type that is opposite to the second conductivity type;
   a plurality of layers of doped structures disposed in the drift region, wherein each layer of doped structure comprises at least one doped bar extending in a lengthwise direction of a conductive channel; and
   a plurality of doped polysilicon pillars that are disposed in the drift region and extend downward through the doped bars of at least one layer of doped structure, wherein ions doped in the doped polysilicon pillars and ions doped in the doped bars have opposite conductivity types.

2. The LDMOS device according to claim 1, wherein the first conductivity type is an N-type, and the second conductivity type is a P-type, and wherein the doped bars are N-type doped, and the doped polysilicon pillars are P-type doped.

3. The LDMOS device according to claim 2, wherein a concentration of the ions doped in the doped bar is higher than a concentration of the ions doped in the drift region.

4. The LDMOS device according to claim 1, wherein the first conductivity type is an N-type, and the second conductivity type is a P-type, and wherein the doped bars are P-type doped, and the doped polysilicon pillars are N-type doped.

5. The LDMOS device according to claim 1, further comprising:
   a source region having the first conductivity type;
   a drain region having the first conductivity type;
   a field oxide layer disposed over the doped polysilicon pillars, wherein a bottom of the field oxide layer is in contact with a top of each of the doped polysilicon pillars;
   a gate extending from a location of the field oxide layer proximal to the source region toward the source region; and
   a substrate pickup region having the second conductivity type and disposed on a side of the source region away from the gate.

6. The LDMOS device according to claim 5, wherein the substrate pickup region is in contact with the source region.

7. The LDMOS device according to claim 5, wherein each doped polysilicon pillar extends from a bottom of the field oxide layer downward through the doped bars of the respective layers of doped structures and terminates within the doped bar located at a lowermost layer of doped structure.

8. The LDMOS device according to claim 7, wherein in a cross-section of each layer of doped structure, a plurality of the doped bars are parallel to one another and the doped polysilicon pillars are arranged in a matrix.

9. The LDMOS device according to claim 5, further comprising a well region having the second conductivity type, in which the source region and the substrate pickup region are disposed.

10. The LDMOS device according to claim 9, wherein a concentration of the second conductivity type ions in the well region is lower than a concentration of the second conductivity type ions in the substrate pickup region.

11. The LDMOS device according to claim 5, further comprising a well region having the first conductivity type, in which the drain region is disposed.

12. A method for fabricating a laterally diffused metal-oxide-semiconductor (LDMOS) device, comprising:
    step A, obtaining a substrate with a drift region, wherein the drift region has a first conductivity type and is formed on the substrate which has a second conductivity type, and wherein the first conductivity type is opposite to the second conductivity type;
    step B, forming a plurality of implantation holes in the drift region by etching;
    step C, implanting dopant ions at a bottom of each of the plurality of implantation holes;
    step D, filling doped polysilicon into the implantation holes, wherein the doped polysilicon and the dopant ions have opposite conductivity types;
    step E, implanting dopant ions at a top of the doped polysilicon in each implantation hole that is located in the drift region, wherein the doped polysilicon and the dopant ions have opposite conductivity types;
    repeating steps D and E for a predetermined number of times such that each implantation hole is filled up with the doped polysilicon, wherein the dopant ions implanted into the drift region by different implantations form doped regions with different depths; and
    step F, forming doped bars extending in a lengthwise direction of a conductive channel by performing a thermal treatment to cause the doped regions at a same depth to diffuse to outside of the implantation holes and merge in the lengthwise direction of the conductive channel.

13. The method of claim 12, further comprising, prior to the formation of the plurality of implantation holes in the drift region by etching, forming a well region having the second conductivity type on the substrate.

14. The method of claim 12, wherein step D further comprises etching back the doped polysilicon in the implantation holes to a depth that is shallower than a depth reached by the previous etching process performed to form the implantation holes so that a portion of the doped polysilicon is remained in each hole.

15. The method of claim 12, further comprising, subsequent to step F:
    forming a field oxide layer over the implantation holes;
    forming a gate; and
    forming a source region having the first conductivity type, a drain region having the first conductivity type and a substrate pickup region having the second conductivity type.

* * * * *